(12) United States Patent
Clark et al.

(10) Patent No.: US 11,502,239 B2
(45) Date of Patent: Nov. 15, 2022

(54) TECHNOLOGIES FOR COMPOSABLE PIEZOELECTRIC ACTUATORS

(71) Applicant: Auburn University, Auburn, AL (US)

(72) Inventors: Jason V. Clark, Auburn, AL (US); Justin V. Clark, San Pablo, CA (US)

(73) Assignee: Auburn University, Auburn, AL (US)

( * ) Notice: Subject to any disclaimer, the term of this patent is extended or adjusted under 35 U.S.C. 154(b) by 461 days.

(21) Appl. No.: 16/558,403

(22) Filed: Sep. 3, 2019

(65) Prior Publication Data
US 2020/0075838 A1    Mar. 5, 2020

Related U.S. Application Data

(60) Provisional application No. 62/726,266, filed on Sep. 2, 2018.

(51) Int. Cl.
| | | |
|---|---|---|
| *H01L 41/09* | (2006.01) | |
| *H01L 41/053* | (2006.01) | |
| *H01L 41/04* | (2006.01) | |

(52) U.S. Cl.
CPC ........ *H01L 41/0953* (2013.01); *H01L 41/042* (2013.01); *H01L 41/053* (2013.01)

(58) Field of Classification Search
CPC . H01L 41/0953; H01L 41/053; H01L 41/042; H01L 41/096; H01L 41/0926
USPC ................................. 310/328, 365, 366, 330
See application file for complete search history.

(56) References Cited

U.S. PATENT DOCUMENTS

| | | | |
|---|---|---|---|
| 7,420,318 B1 * | 9/2008 | Pulskamp | ............. H01L 41/096 |
| | | | 310/311 |
| 2010/0118405 A1 * | 5/2010 | Allison | .................... H02N 2/02 |
| | | | 359/579 |
| 2010/0245966 A1 | 9/2010 | Yasuda | |
| 2013/0334928 A1 * | 12/2013 | Clark | ..................... H01L 41/09 |
| | | | 310/317 |

FOREIGN PATENT DOCUMENTS

WO    WO 2009/007047    1/2009

OTHER PUBLICATIONS

Romasanta, et al., *Progress in Polymer Science*, 2015; vol. 51 No. 1., p. 188-211.
International Search Report and Written Opinion issued for PCT/US2019/049256, dated Mar. 13, 2020.

* cited by examiner

*Primary Examiner* — Derek J Rosenau
(74) *Attorney, Agent, or Firm* — Barnes & Thornburg LLP

(57) ABSTRACT

Technologies for a microelectromechanical system (MEMS) made up of composable piezoelectric actuators is disclosed. An elongated piezoelectric rod is disposed between a top and a bottom electrode. The top electrode runs along one edge of the top of the piezoelectric rod for a first segment, then runs along the other edge of the top of the piezoelectric rod for the a second segment. When a voltage is applied across the electrodes, the piezoelectric rod bends in a first direction for the first segment and in a second direction opposite the first for the second segment, displacing the tip of the rod. Several such rods can be joined in parallel and/or series, allowing for large-scale systems to be composed.

17 Claims, 9 Drawing Sheets

TECHNOLOGIES FOR COMPOSABLE PIEZOELECTRIC ACTUATORS

CROSS-REFERENCE TO RELATED APPLICATIONS

This application claims priority under 35 U.S.C. § 119(e) to U.S. Provisional Application Ser. No. 62/726,266 filed on Sep. 2, 2018, the entire disclosure of which is incorporated herein by reference.

BACKGROUND

Microelectromechanical systems (MEMS) are used in accelerometers, gyroscopes, digital displays, and many other systems. One important technology in MEMS systems are piezoelectric materials, allowing for movement in MEMS with a simple application of an electric field, without requiring gears, bearings, lubrication, etc. However, the relatively small change in dimension offered by piezoelectric materials limits the range of motion and has prevented large-scale movement based on piezoelectric actuators.

SUMMARY

According to one aspect of the disclosure, a microelectromechanical system (MEMS) comprising an elongated rod, wherein the elongated rod is piezoelectric, wherein the elongated rod has a top side and a bottom side opposite the top side, wherein the top side has a first long edge and a second long edge; a first electrode disposed adjacent the bottom side of the elongated rod; and a second electrode disposed adjacent the top side of the elongated rod, wherein the second electrode has a first segment that is closer to the first long edge of the elongated rod than the second long edge of the elongated rod and a second segment that is closer to the second long edge of the elongated rod than the first long edge of the elongated rod.

In some embodiments, the elongated rod has a length between 20 and 2000 micrometers, wherein the elongated rod has a height between the top side and the bottom side between 0.1 and 100 micrometers, and wherein the elongated rod has a width between 0.1 and 100 micrometers.

In some embodiments, the first and second electrodes are configured such that, when a voltage is applied across the first electrode and the second electrode, an electric field is generated between the second and first electrodes such that a first segment of the rod bends in a first direction and a second segment of the rod bends in a second direction approximately opposite the first direction.

In some embodiments, the MEMS may further include a locking mechanism to mechanically engage with the elongated rod when the first segment is bent in the first direction and the second segment is bent in the second direct, wherein the locking mechanism is configured to hold the elongated rod in place upon removal of the voltage.

In some embodiments, the MEMS may further include an anchor supporting a proximal end of the elongated rod; a second elongated rod, wherein the second elongated rod is piezoelectric, wherein the second elongated rod has a top side and a bottom side opposite the top side, wherein the top side of the second elongated rod has a first long edge and a second long edge, wherein a proximal end of the second elongated rod is connected to a distal end of the elongated rod, wherein the first electrode extends along the bottom side of the second elongated rod; wherein the second electrode extends along the top side of the second elongated rod, wherein the second electrode has a third segment that is closer to the first long edge of the second elongated rod than the second long edge of the second elongated rod and a fourth segment that is closer to the second long edge of the second elongated rod than the first long edge of the second elongated rod.

In some embodiments, the MEMS may further include an anchor supporting a proximal end of the elongated rod; a plurality of additional elongated rods, wherein each of the plurality of additional elongated rods is piezoelectric, wherein each of the plurality of additional elongated rods has a top side and a bottom side opposite the top side, wherein the top side of each of the plurality of additional elongated rods has a first long edge and a second long edge, and wherein each of the plurality of additional elongated rods has a proximal end supported by the anchor, a plurality of bottom electrodes, wherein each of the plurality of bottom electrodes is disposed adjacent the bottom side of one of the plurality of additional elongated rods; and a plurality of top electrodes, wherein each of the plurality of top electrodes is disposed adjacent the top side of one of the plurality of additional elongated rods, wherein each of the plurality of top electrodes has a first segment that is closer to the first long edge of the corresponding additional elongated rod than the second long edge of the corresponding additional elongated rod and a second segment that is closer to the second long edge of the corresponding additional elongated rod than the first long edge of the corresponding additional elongated rod; a first connector electrode disposed on the anchor, wherein the first connector electrode is connected to the first electrode and to each of the plurality of bottom electrodes; and a second connector disposed on the anchor, wherein the second connector electrode is connected to the second electrode and to each of the plurality of top electrodes.

In some embodiments, the MEMS may further include a plurality of groups of elongated rods, wherein each of the plurality of groups of elongated rods comprises a proximal anchor elongated along an axis and a distal anchor elongated along an axis; a plurality of elongated rods, wherein each of the plurality of elongated rods is piezoelectric, wherein each of the plurality of elongated rods has a top side and a bottom side opposite the top side, wherein the top side of each of the plurality of elongated rods has a first long edge and a second long edge wherein each of the plurality of elongated rods has a proximal end supported by the proximal anchor and a distal end supported by the distal anchor; a plurality of bottom electrodes, wherein each of the plurality of bottom electrodes is disposed adjacent the bottom side of one of the plurality of elongated rods; and a plurality of top electrodes, wherein each of the plurality of top electrodes is disposed adjacent the top side of one of the plurality of elongated rods, wherein each of the plurality of top electrodes has a first segment that is closer to the first long edge of the corresponding elongated rod than the second long edge of the corresponding elongated rod and a second segment that is closer to the second long edge of the corresponding elongated rod than the first long edge of the corresponding elongated rod; a first connector electrode disposed on the proximal anchor or the distal anchor, wherein the first connector electrode is connected to each of the plurality of bottom electrodes; and a second connector disposed on the proximal anchor or the distal anchor, wherein the second connector electrode is connected to each of the plurality of top electrodes, wherein the first connector electrode of each of the plurality of groups of elongated rods is electrically coupled to the first connector electrode of each other of the plurality of groups of elongated rods, wherein the second connector electrode of each of the plurality of groups of elongated rods is electrically coupled to the second connector electrode of each other of the plurality of groups of elongated rods, wherein, when a voltage is applied between the first connector electrodes of the plurality of groups of elongated rods and the second connector electrodes of the plurality of groups of elongated rods, an electric field is applied to each of the plurality of elongated rods of each of the plurality of groups of elongated rods such that each of the plurality of elongated rods of each of the plurality of groups of elongated rods applies a force to translate the distal anchor of the corresponding group of elongated rods in a first direction along its axis relative to the proximal anchor of the corresponding group of elongated rods, wherein the distal anchor of at least one of the plurality of groups of elongated rods is mechanically coupled to the proximal anchor of at least one other of the plurality of groups of elongated rods such that a translation of the distal anchor of the at least one of the plurality of groups of elongated rods causes a translation of the proximal anchor of the at least one other of the plurality of groups of elongated rods.

In some embodiments, the plurality of groups of elongated rods are disposed on a substrate sheet, wherein the substrate sheet is rolled around an axis parallel to the axis of the distal anchor of the at least one of the plurality of groups of elongated rods.

In some embodiments, the MEMS may further include a two-dimensional array of elongated rods comprising the plurality of groups of elongated rods, wherein each of the plurality of groups of elongated rods are substantially coplanar; a plurality of additional two-dimensional arrays, wherein each of the plurality of two-dimensional arrays is substantially the same as the two-dimensional array of elongated rods, wherein the two-dimensional array of elongated rods and the plurality of additional two-dimensional arrays are arranged along an axis perpendicular to the two-dimensional array.

In some embodiments, the MEMS may further include control circuitry electrically coupled to the first electrode and to the second electrode, wherein the control circuitry is configured to control a voltage applied across the first electrode and the second electrode.

In some embodiments, the control circuitry is further configured to determine a desired stiffness of the elongated rod; determine a voltage corresponding to the desired stiffness; and apply the voltage corresponding to the desired stiffness across the first electrode and the second electrode.

In some embodiments, the control circuitry is further configured to measure a voltage across the first electrode and the second electrode; and determine, based on the measured voltage, a position of a distal tip of the elongated rod.

In some embodiments, the control circuitry is further configured to apply an oscillating voltage across the first electrode and the second electrode, wherein the applied voltage causes a distal tip of the elongated rod to oscillate; measure a displacement of a sensor caused by the oscillation of the distal tip of the elongated rod; and determine a rotation of the MEMS based on the measured displacement of the sensor.

In some embodiments, the elongated rod is mechanically coupled to a contact of an electromechanical switch, wherein the control circuitry is configured to move the contact from an open position to a closed position and from a closed position to an open position.

In some embodiments, the MEMS is implanted into a human body.

In some embodiments, the MEMS may further include control circuitry electrically coupled to the first electrode and to the second electrode, wherein the control circuitry is configured to receive a current to convert mechanical energy of the elongated rod to electrical energy.

According to one aspect of the disclosure, a microelectromechanical system (MEMS) comprising a rod elongated along an axis, the rod comprising a first segment near a proximal end of the rod and a second segment near a distal end of the rod, wherein the rod is piezoelectric; a first electrode disposed along the axis of the rod; and a second electrode disposed along the axis of the rod, wherein the first and second electrodes are configured such that, when a voltage is applied across the first electrode and the second electrode, an electric field applied to the first segment of the rod has a gradient such that the first segment of the rod bends in a first direction and an electric field applied to the second segment of the rod has a gradient such that the second segment of the rod bends in a second direction approximately opposite the first direction.

In some embodiments, the elongated rod has a length between 20 and 2000 micrometers, wherein the elongated rod has a height between the top side and the bottom side between 0.1 and 100 micrometers, and wherein the elongated rod has a width between 0.1 and 100 micrometers.

According to one aspect of the disclosure, a microelectromechanical system (MEMS) comprising an elongated rod, the rod comprising a first segment and a second segment, wherein the elongated rod is piezoelectric; means for creating an electric field at the first segment of the elongated rod that causes the first segment of the rod to bend in a first direction; and means for creating an electric field at the second segment of the elongated rod that causes the second segment of the rod to bend in a second direction approximately opposite the first.

In some embodiments, the elongated rod has a length between 20 and 500 micrometers, wherein the elongated rod has a height between the top side and the bottom side between 0.1 and 100 micrometers, and wherein the elongated rod has a width between 0.1 and 100 micrometers.

In some embodiments, the MEMS may further include a plurality of elongated rods, each of the plurality of elongated rods comprising a first segment and a second segment, wherein each of the elongated rods is piezoelectric; means for creating an electric field across each of the plurality of elongated rods; and means for mechanically connecting the plurality of elongated rods in both series and parallel.

In some embodiments, the MEMS may further include means for disposing the plurality of elongated rods in a coiled sheet.

In some embodiments, the MEMS may further include means for disposing the plurality of elongated rods in a coiled sheet.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1A:
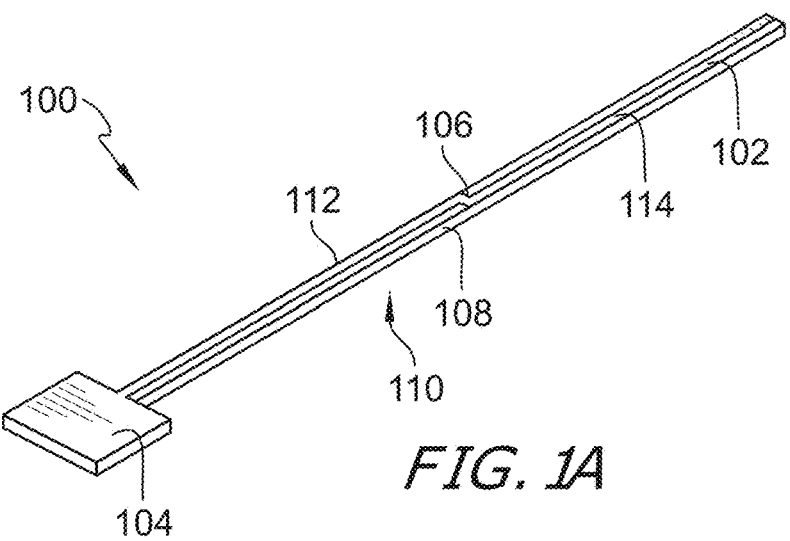
FIGS. 1A-1C are a simplified block diagram of at least one embodiment of a composable piezoelectric actuator.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features. It should be appreciated that, as used herein, terms such as "top," "bottom," "horizontal," "vertical," etc. may be used to describe relative positions of components but do not imply that a particular orientation of a device is required.

Figure 1B:
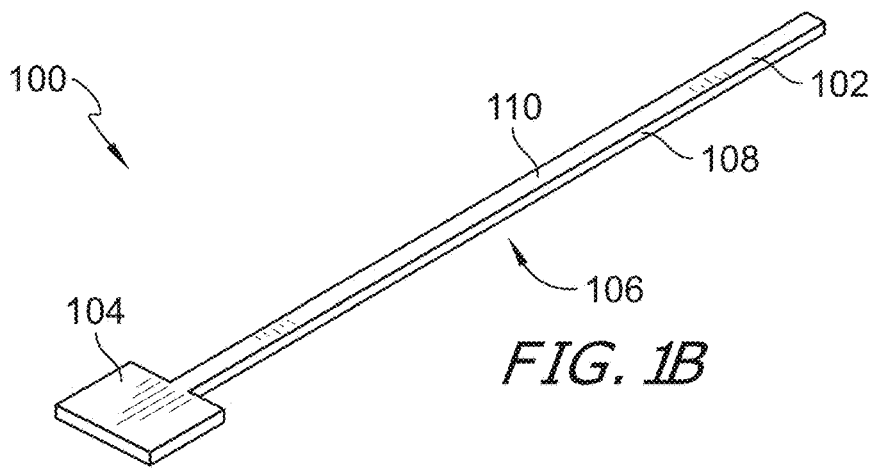
Figure 1C:
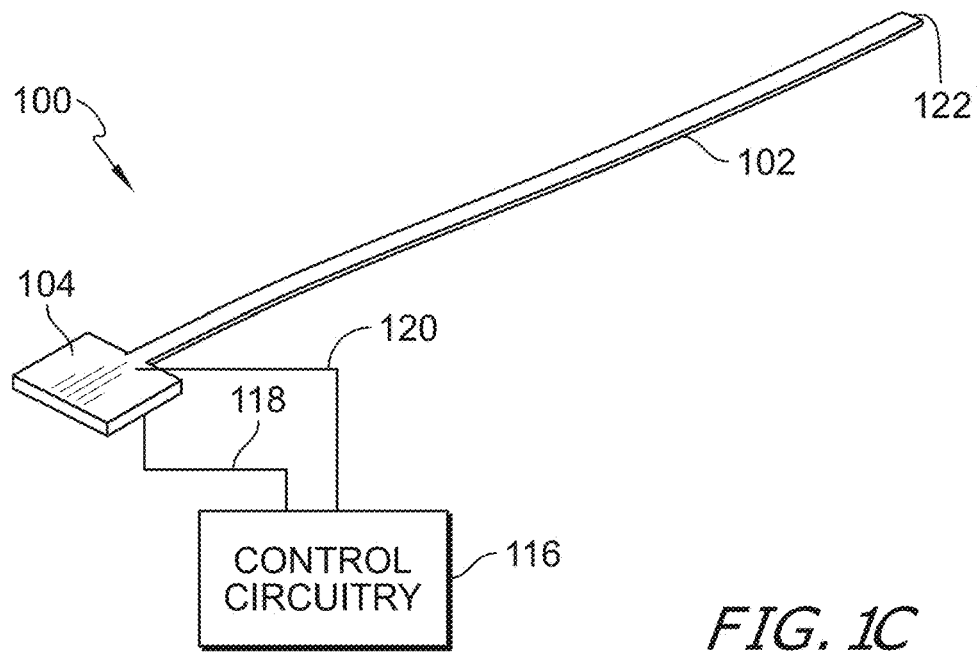

Referring now to FIGS. 1A-1C, an illustrative microelectromechanical system (MEMS) 100 includes a rod 102 connected to an anchor 104. The rod 102 includes a top electrode 106, an elongated rod 108, and a bottom electrode 110. In the illustrative embodiment, the top electrode 106 includes a first segment 112 and a second segment 114, as shown in FIG. 1A. The first segment 112 is a thin strip covering about half of the width of the elongated rod 108 and runs along one edge of the elongated rod 108. The second segment 114 is also a thing strip covering about half of the width of the elongated rod 108 and runs along a second edge of the elongated rod 108. The first segment 112 is connected to the second segment 114 in approximately the middle of the rod 102. The illustrative top electrode 106 covers the top surface of the anchor 104. The illustrative bottom electrode 106 extends approximately the entire bottom surface of the elongated rod 108 and the bottom surface of the anchor 104, as shown in FIG. 1B.

The elongated rod 108 is made of a piezoelectric material, so the physical dimensions of the rod 102 can change through application of an electric field across the material. For example, the rod 102 may be polyvinylidene fluoride (PVDF), lead zirconate titanate (PZT), or any other suitable piezoelectric material. The material used in a particular embodiment may depend on, e.g., physical properties such as stiffness or density, ease of manufacture, biocompatibility, etc. For example, in some embodiments, the MEMS 100 may be integrated into an implanted device in a human body. In such embodiments, biocompatible PVDF may be preferred instead of the lead-containing PZT. In the illustrative embodiment, the anchor 104 is made of the same material as the elongated rod 108. Additionally or alternatively, the anchor 104 may be made up of a different material.

Referring now to FIG. 1C, control circuitry 116 may apply a voltage across the top electrode 106 and the bottom electrode 110, such as through a ground wire 118 connected to the bottom electrode 110 on the anchor 104 and a control wire 120 connected to the top electrode 106 on the anchor 104. (The top and bottom electrodes 106, 110 are not shown in FIG. 1C or the remaining figures in the interest of clarity.) When a voltage is applied across the top electrode 106 and the bottom electrode 110, an electric field is applied across the piezoelectric elongated rod 108. It should be appreciated that the electric field applied across the elongated rod 108 is not uniform. In particular, the first segment 112 of the top electrode 106 will apply a stronger electric field to the side of the elongated rod 108 covered by the first segment 112, creating a gradient in the electric field below the first segment 112. Similarly, the second segment 114 of the top electrode 106 will apply a strong electric field to the other side of the elongated rod 108 that is covered by the second segment 112, creating a gradient in the electric field below the second segment 114 that mirrors the gradient below the first segment 112. As a result of the gradient in the electric field, the part of the elongated rod 108 that is directly below the first segment 112 of the electrode 106 will be extended in length through the piezoelectric effect relative to the adjacent part of the elongated rod 108 that is not directly below the first segment 112 of the electrode 106, causing the part of the rod 102 corresponding to the first segment 112 to bend in a first direction. The gradient of the electric field caused by the second segment 114 of the top electrode 106 produces a mirrored effect, causing the part of the rod 102 corresponding to the second segment 114 to bend in a direction opposite the first direction. As a result, a tip 122 of the rod is displaced as shown in FIG. 1C, without a significant rotation.

It should be appreciated that the displacement without significant rotation allows for several of the rods 102 to be joined together, as shown in FIGS. 2-9. For example, the top electrode 106 and bottom electrode 108 may be common among many arms 102, allowing for a single voltage to be applied to move several arms 102. As each arm 102 of an array of arms 102 is displaced the same amount without any significant rotation, the tops 122 of the arms 102 of the array can be joined together and connected to another array of arms 102, allowing for large-scale MEMS to be composed from smaller arrays of arms 102, as shown in more detail below in regard to FIGS. 2-9. As the motion of the MEMS 100 is due to a deformation of the material itself, no lubrication is required.

The control circuitry 116 may be embodied as any suitable control circuitry 116. For example, in some embodiments, the control circuitry 116 may be a simple voltage source, such as a battery, with a switch. Additionally or alternatively, the control circuitry 116 may be embodied as more advanced circuitry, such as a microcontroller, a microprocessor, a field programmable gate array (FPGA), an application specific integrated circuit (ASIC), etc. It should be appreciated that the control circuitry 116 may be able to apply several different voltage levels, such as any voltage between 0-40 volts. In some embodiments, the control circuitry 116 may be connected through a wired or wireless connection to another device, and the control circuitry 116 may be able to send messages and/or power to and from the other device. Each of FIGS. 2-9 may include similar control circuitry as control circuitry 116, which is not depicted in the interest of clarity.

In the illustrative embodiment, the elongated rod 108 is 200 micrometers long, with a width of 4 micrometers and a height (i.e., distance between the top electrode 106 and the bottom electrode 110) of 2 micrometers. In other embodiments, the elongated rod 108 may have a length between 30 and 500 micrometers, and the height and/or width of the elongated rod 108 be between 0.1 and 100 micrometers. Each of the top electrode 106 and the bottom electrode 110 may be any suitable conductive material, such as gold, copper, aluminum, doped semiconductor, etc. The top electrode 106 and the bottom electrode 110 may be any suitable thickness, such as 0.05 micrometers. The dimensions of the elongated rod 108 may depend on the particular application being used. For example, if higher stiffness is required, an elongated rod 108 with a higher cross-section may be used. If higher deflection with a lower voltage is desired, a thinner elongated rod 108 may be used.

It should be appreciated that, in the illustrative embodiment, the change in length of the rod 102 due to the applied electric field is relatively small, such as 0.1%. However, the deflection caused by the applied electric field can be relatively large. For example, in the illustrative embodiment, a rod 102 with a length of 200 micrometers and a width of 4 micrometers can be displaced over 10 micrometers with an applied voltage of 34 volts, leading to a displacement that is over 2.5 times the width of the rod 102.

It should be appreciated that the specific configuration shown in FIG. 1A of the anchor 104, the elongated rod 108, and electrodes 106, 110 is just one possible configuration of the MEMS 100, and that the approach disclosed herein is compatible with many different configurations. For example, in some embodiments, the bottom electrode 110 may follow a meandering path similar to the top electrode 106, which may provide a stronger, more confined electric field across the elongated rod 108. In some embodiments, a width and/or height of the elongated rod 108 may change along the length of the elongated rod 108, leading to different mechanical properties and different amounts of curvature, which may be controlled with different length or shape electrodes. In some embodiments, the cross-section of the elongated rod 108 may not be uniform along its length, but the rod 108 may meander in a similar manner as the top electrode 106 shown in FIG. 1A. In some embodiments, the rod 108 may be manufactured to that it is curved while in a relaxed state (i.e., without an electric field applied), and the rod 108 may be straightened upon application of a voltage across the electrodes 106, 110. It should be appreciated that, in FIG. 1A, the piezoelectric material of the rod 108 has a particular crystal orientation and/or is poled in a direction such that the applied electric field causes the rod 108 to bend as shown. Additionally or alternatively, the piezoelectric rod 108 may have a different crystal orientation and/or poling direction such that it responds differently to an applied electric field, such as rotating in an orthogonal direction from that shown in FIG. 1C.

Figure 2A:
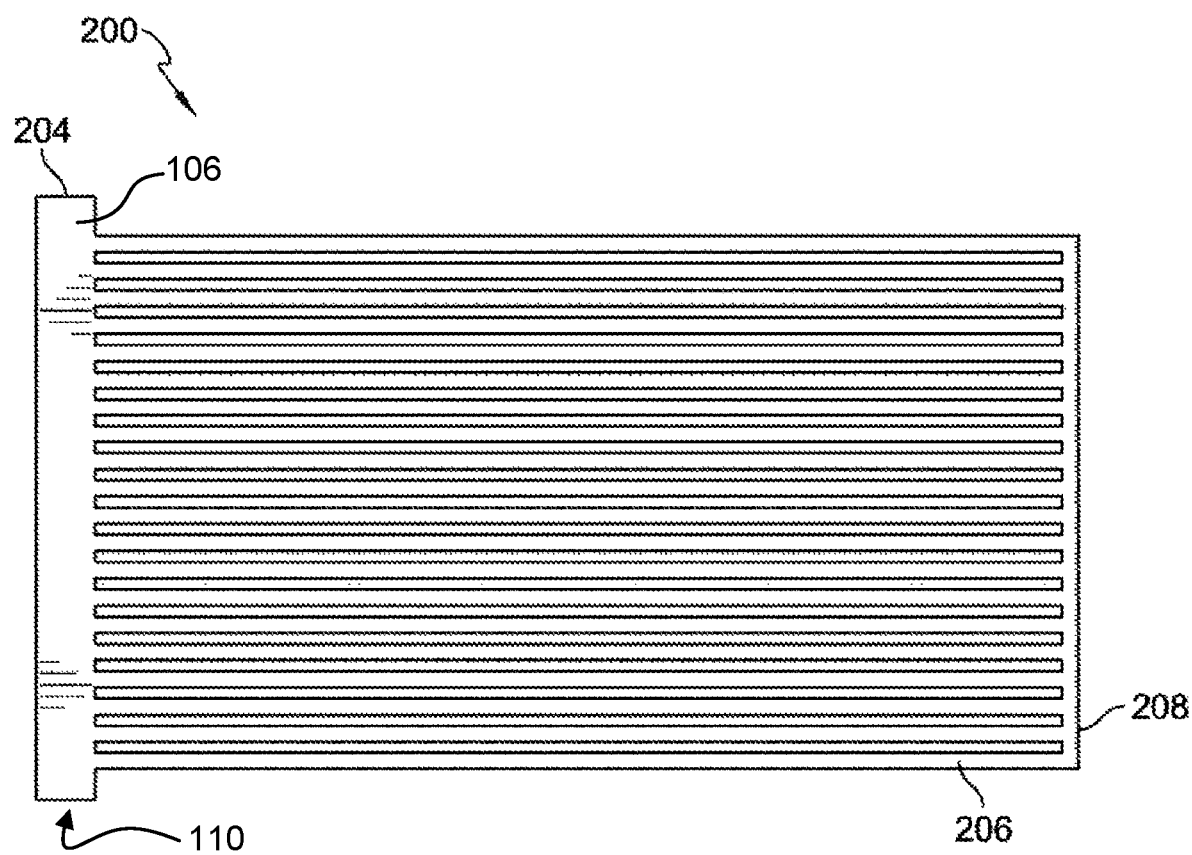
FIGS. 2A and 2B are a simplified block diagram of at least one embodiment of several of the composable piezoelectric actuators of FIG. 1A connected in parallel.
Figure 2B:
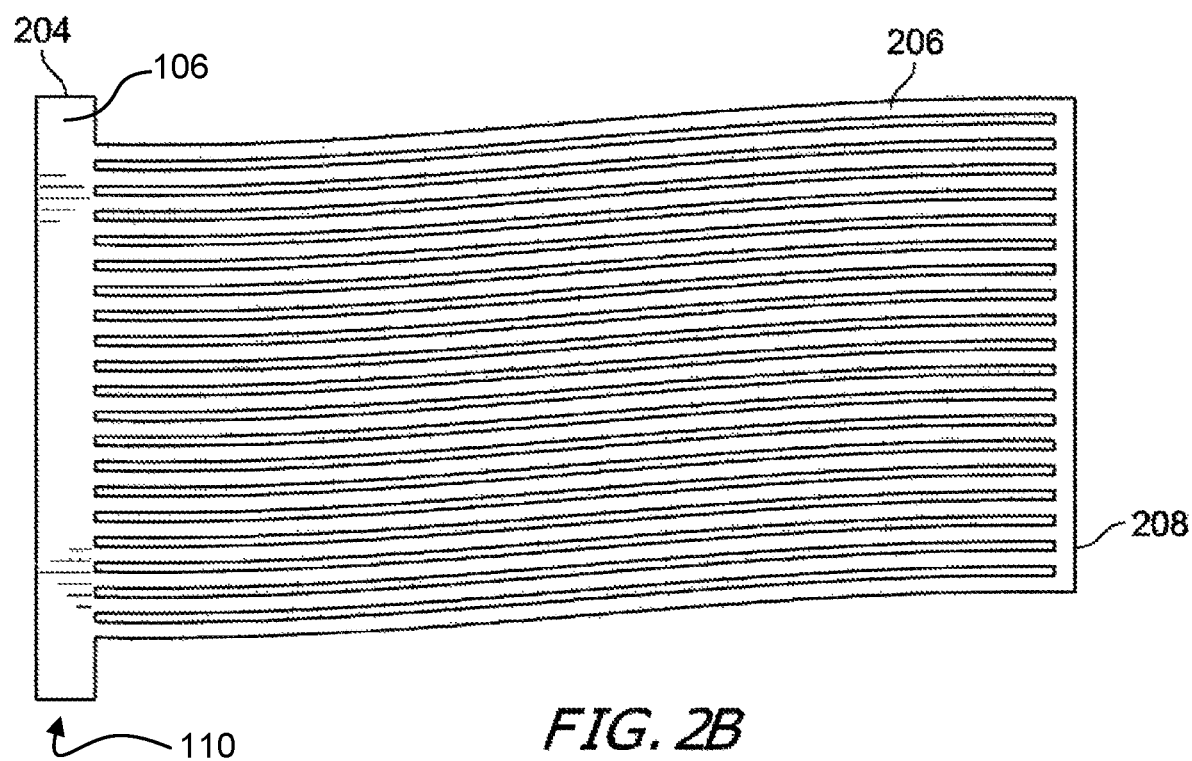

Referring now to FIGS. 2A and 2B, a MEMS 200 may be made up of several rods 206, with each of the rods 206 having a proximal end connected to a proximal anchor 204 and a distal end connected to a distal anchor 208. Each of the rods 206 may be similar to the rods 102 discussed above in regard to FIG. 1A, and the proximal anchor 204 and the distal anchor 208 may be similar to the anchor 104 discussed above in regard to FIG. 1A. In the illustrative embodiment, the top and bottom electrodes of each rod 206 and anchor 204, 208 are all connected together, forming one top electrode and one bottom electrode. When a voltage is placed across those electrodes, each of the rods 206 is bent from a straight position shown in FIG. 2A to a displaced position shown in FIG. 2B. As each of the rods 206 is connected in parallel to the same fixed base anchor 204, the rods 206 all apply the same force in the same direction to the distal anchor 208. It should be appreciated that properties of the MEMS 200 may be different from that of the MEMS 100 due to the presence of several rods. For example, the MEMS 200 may be able to apply a force that is twenty times higher than that of the MEMS 100, due to the presence of twenty rods 206 in the MEMS 200 as compared to the presence of one rod 102 in the MEMS 100, and the resistance to displacement (i.e., the stiffness) along the direction of motion may be increased by a factor of twenty. It should be appreciated that any number of rods 206 could be connected in parallel in this manner, such as any number from two to one thousand rods 206.

Figure 3A:
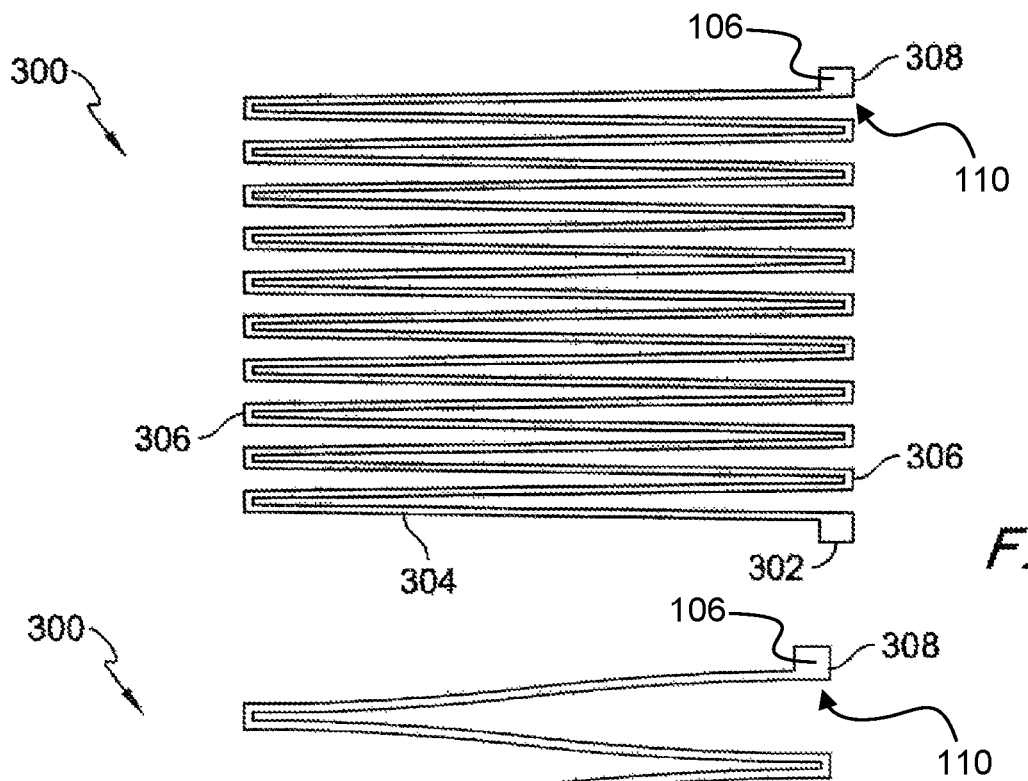
FIGS. 3A and 3B are a simplified block diagram of at least one embodiment of several of the composable piezoelectric actuators of FIG. 1A connected in series.
Figure 3B:
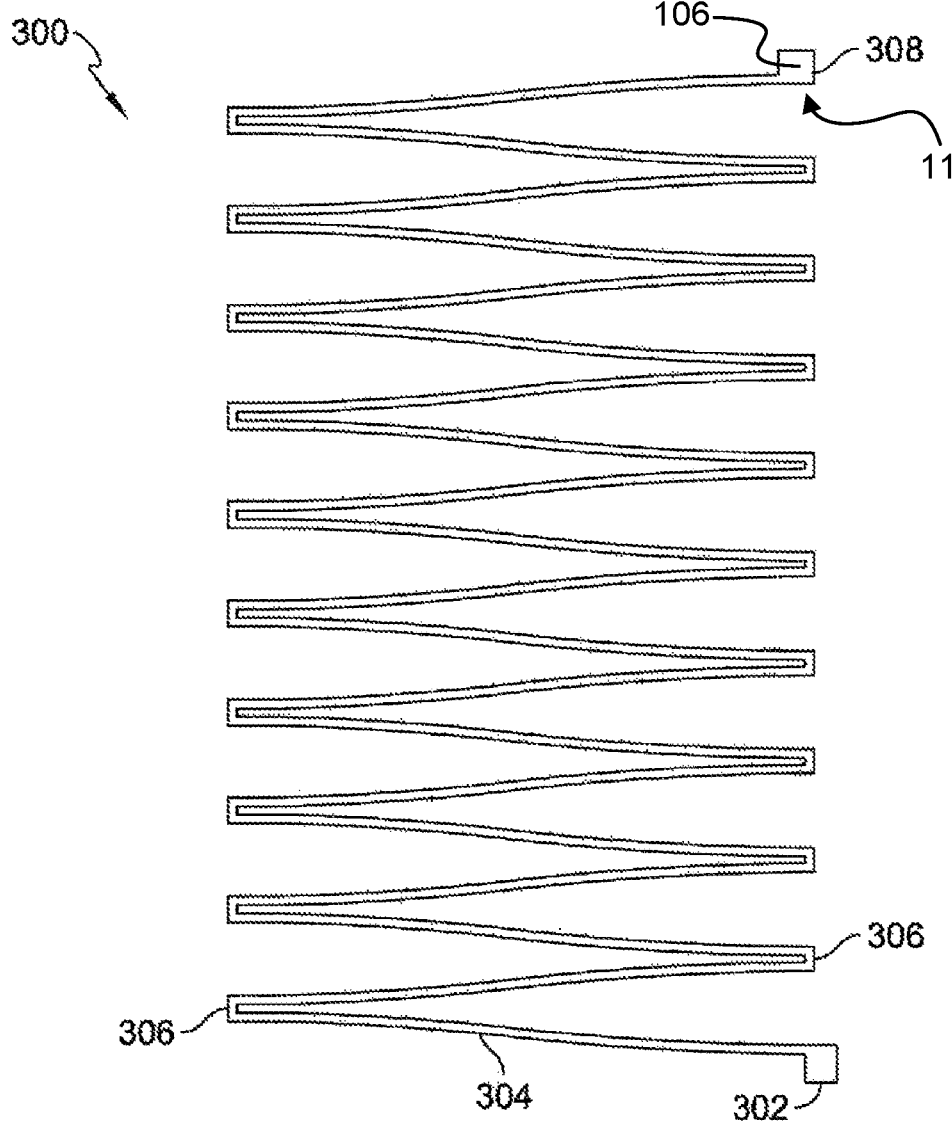
Figure 4A:
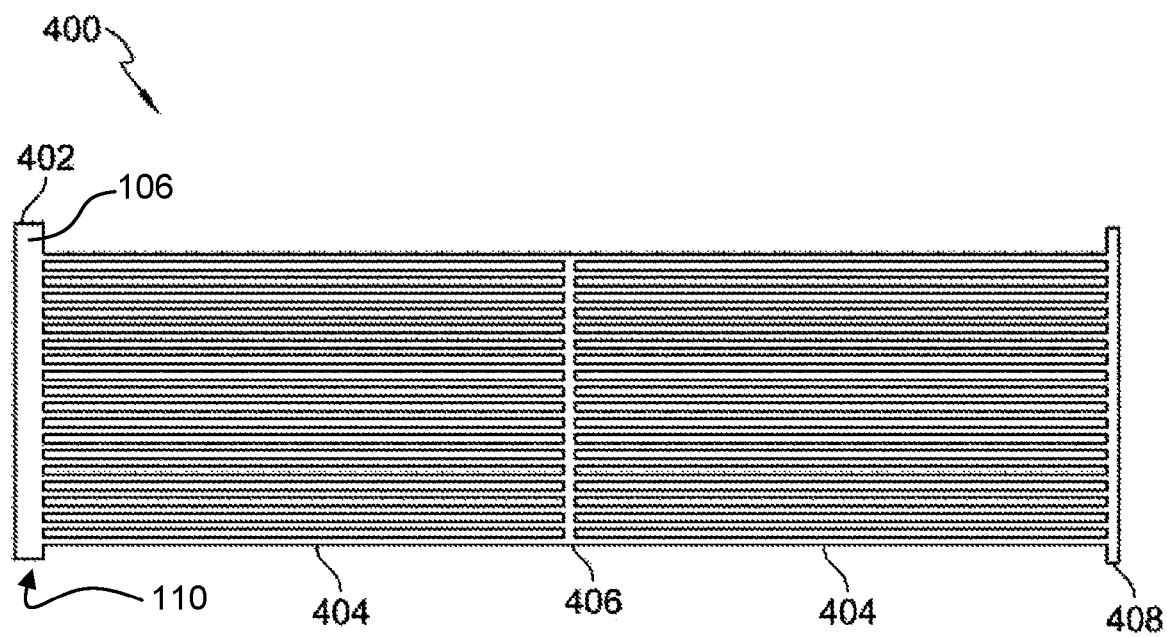
FIGS. 4A and 4B are a simplified block diagram of at least one embodiment of several of the composable piezoelectric actuators of FIG. 1A connected in both parallel and series.
Figure 4B:
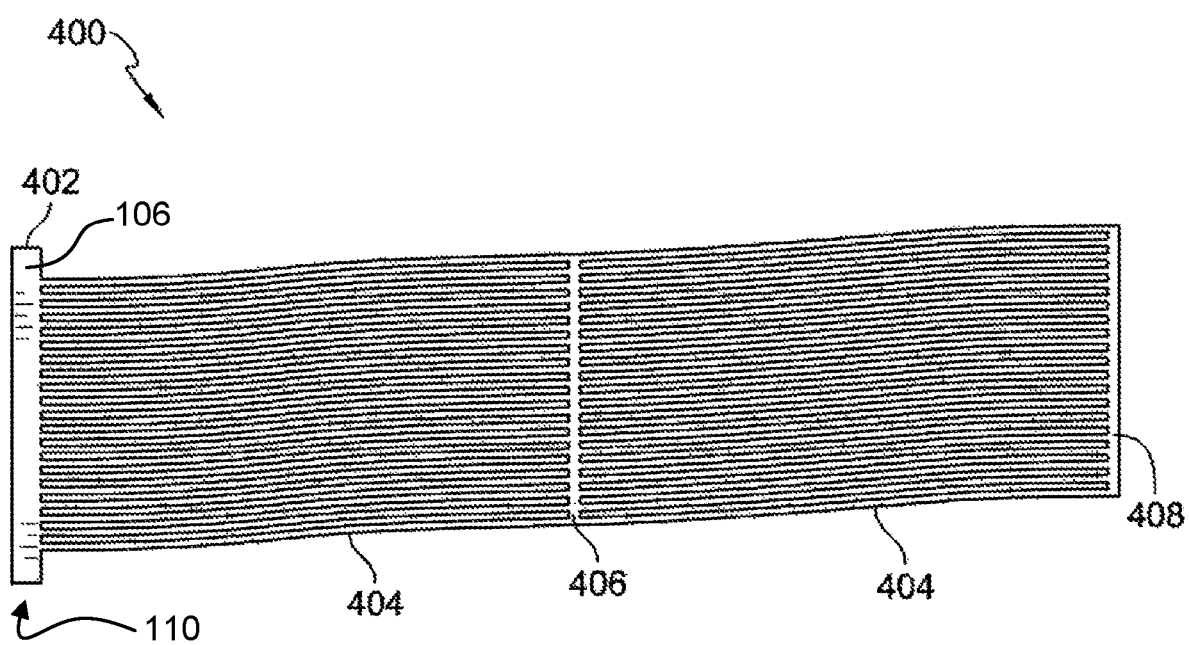
Figure 5A:
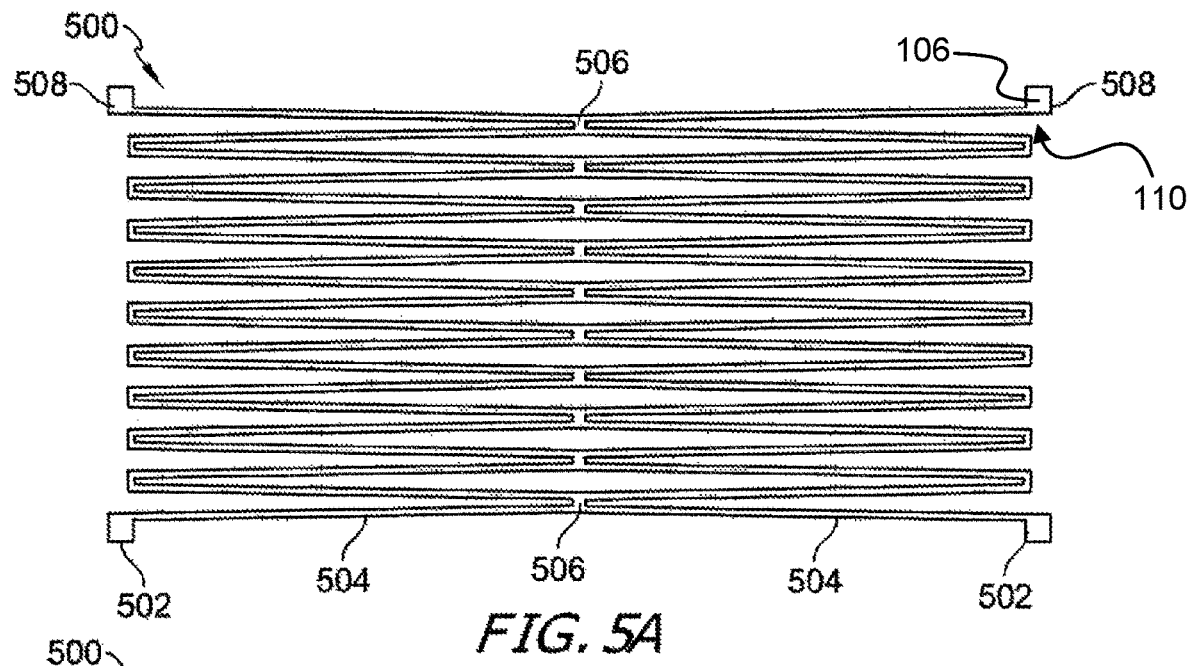
FIGS. 5A and 5B are a simplified block diagram of at least one embodiment of several of the composable piezoelectric actuators of FIG. 1A connected in both parallel and series.
Figure 5B:
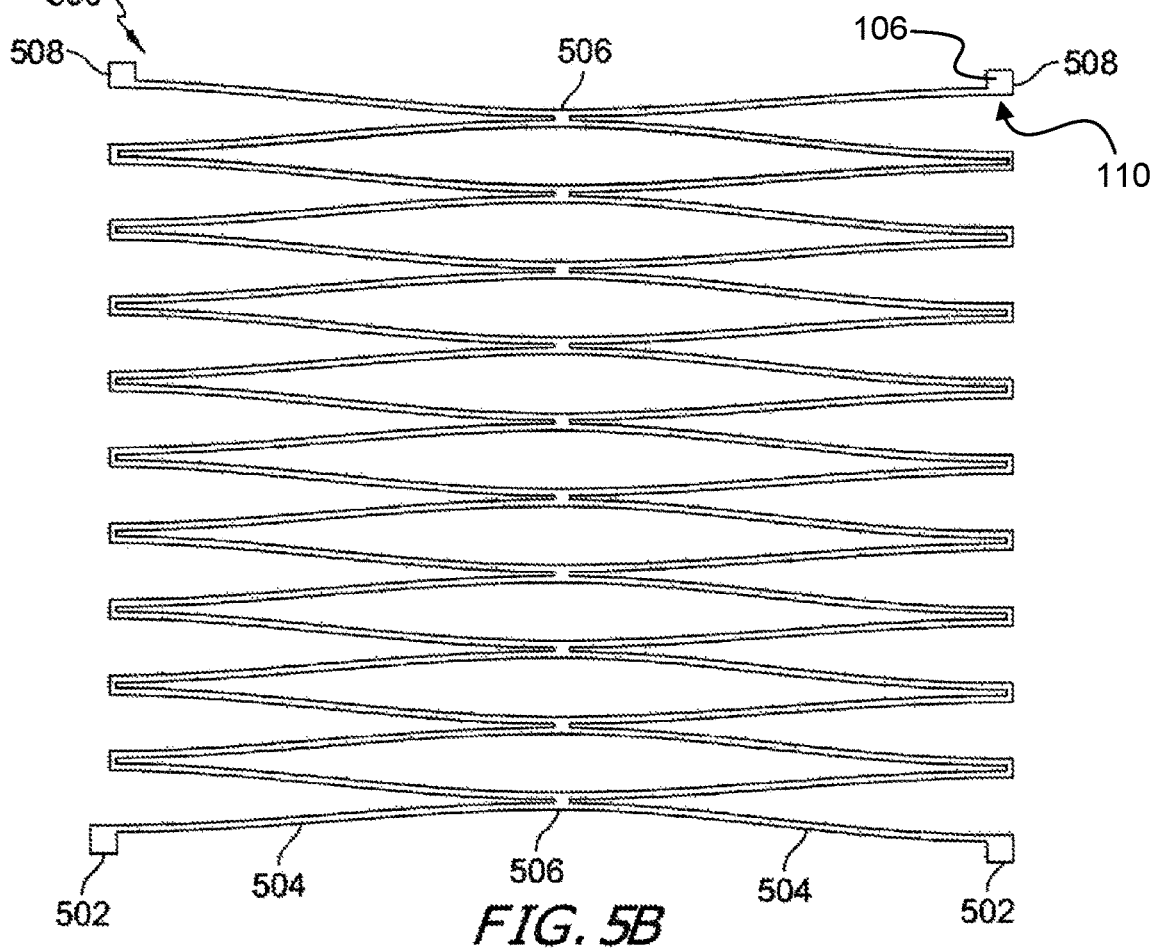

Referring now to FIGS. 3A and 3B, a MEMS 300 includes a base anchor 302, several rods 304, several intermediate anchors 306, and an end anchor 308. One of the rods 304 has a proximal end connected to the base anchor 302 and a distal end connected to an intermediate anchor 306. Each additional rod 304 is connected to the previous rod 304 through an intermediate anchor 306, and the final rod 304 is connected to the end anchor 308. Each of the rods 304 may be similar to the rods 102 discussed above in regard to FIG. 1A, and the base anchor 302, the intermediate anchor 306, and the end anchor 308 may be similar to the anchor 104 discussed above in regard to FIG. 1A. In the illustrative embodiment, the top and bottom electrodes of each rod 304 and anchor 302, 306, 308 are all connected together, forming one top electrode and one bottom electrode. When a voltage is placed across those electrodes, each of the rods 304 is bent from a straight position shown in FIG. 3A to a displaced position shown in FIG. 3B. As each of the twenty rods 304 are connected in series in the illustrative embodiment, each intermediate anchor 306 is moved an amount based on the number of rods 206 between that intermediate anchor 306 and the base anchor 302, resulting in a displacement between the base anchor 302 and the end anchor 308 that is twenty times the displacement of a single rod 304. It should be appreciated that any number of rods 304 could be connected in parallel in this manner, such as any number from two to one thousand rods 304.

It should be appreciated that, in some embodiments, the rods may be connected both in parallel and in series. For example, in FIG. 4A, a MEMS 400 may include rods 404 connected in both parallel and series. The MEMS 400 includes a base anchor 402, the rods 404, an intermediate anchor 406, and an end anchor 408. Each of the rods 404 may be similar to the rods 102 discussed above in regard to FIG. 1A, and the base anchor 402, the intermediate anchor 406, and the end anchor 408 may be similar to the anchor 104 discussed above in regard to FIG. 1A. In the illustrative embodiment, the top and bottom electrodes of each rod 404 and anchor 402, 406, 408 are all connected together, forming one top electrode and one bottom electrode. When a voltage is placed across those electrodes, each of the rods 404 is bent from a straight position shown in FIG. 4A to a displaced position shown in FIG. 4B. The embodiment shown in FIG. 4A has two sets of twenty rods 404 each connected in series, with each set having its rods 404 connected in parallel. As a result, the MEMS 400 shown in FIG. 4A can apply twenty times the force and have twice the displacement of the MEMS 100 with the single rod 102 shown in FIG. 1A.

It should be appreciated that there are several ways of connecting the rods in serial and/or in parallel. As another example, in FIG. 5A, a MEMS 500 may include rods 504 connected in both parallel and series. The MEMS 500 includes two base anchors 502, the rods 504, intermediate anchors 506, and end anchor 508. Each of the rods 504 may be similar to the rods 102 discussed above in regard to FIG. 1A, and the base anchor 502, the intermediate anchor 506, and the end anchor 508 may be similar to the anchor 104 discussed above in regard to FIG. 1A. In the illustrative embodiment, the top and bottom electrodes of each rod 504 and anchor 502, 506, 508 are all connected together, forming one top electrode and one bottom electrode. When a voltage is placed across those electrodes, each of the rods 504 is bent from a straight position shown in FIG. 5A to a displaced position shown in FIG. 5B. The embodiment shown in FIG. 5A has two sets of twenty rods 504 each connected in parallel, with each set having its rods 504 connected in series. As a result, the MEMS 500 shown in FIG. 5A can apply twice the force and have twenty times the displacement of the MEMS 100 with the single rod 102 shown in FIG. 1A.

Figure 6A:
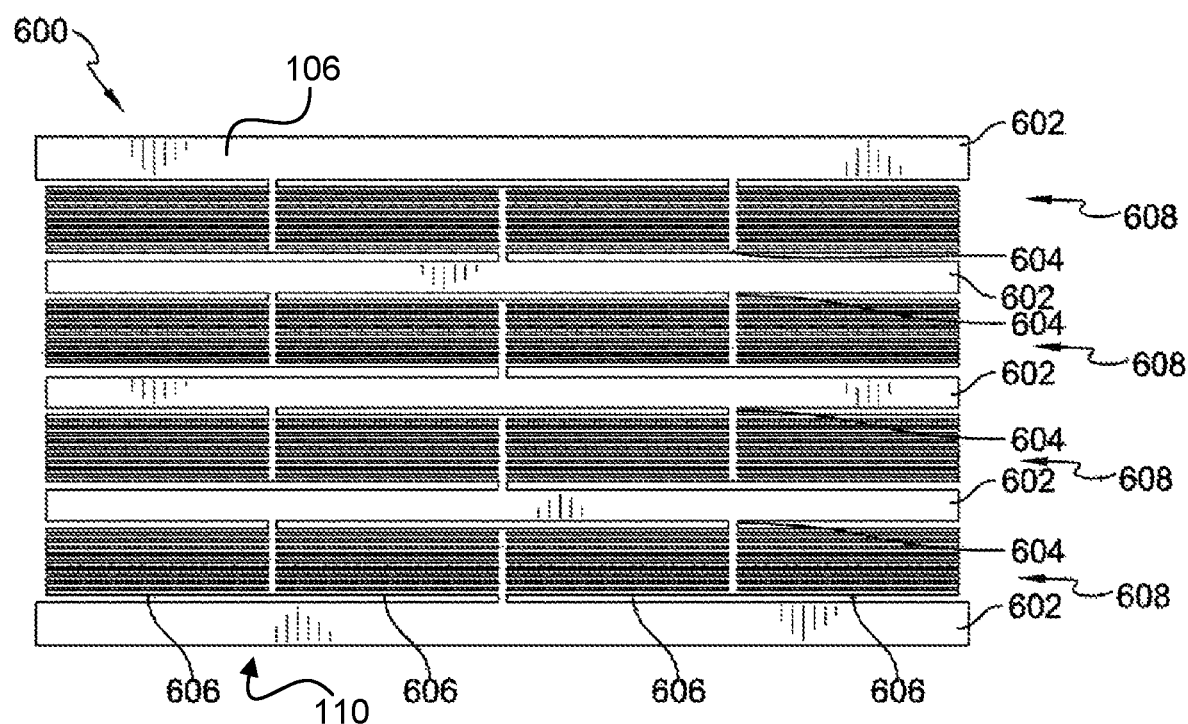
FIGS. 6A and 6B are a simplified block diagram of at least one embodiment of several of the composable piezoelectric actuators of FIG. 1A connected in both parallel and series.
Figure 6B:
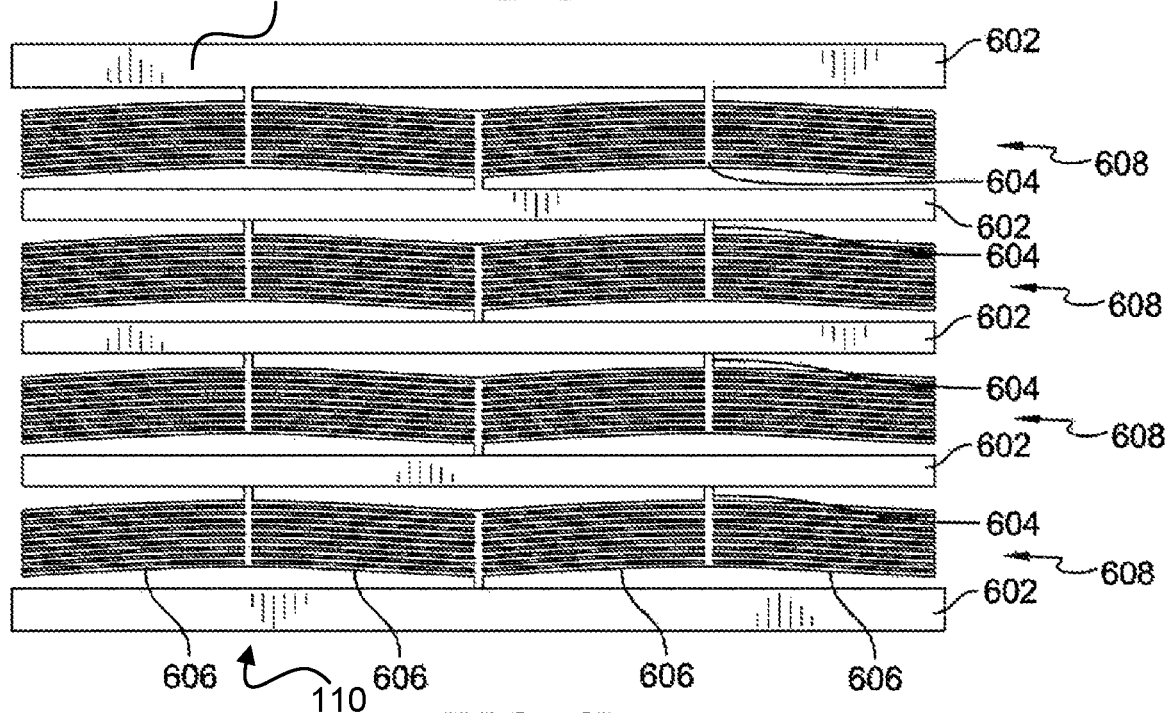

As another example, in FIG. 6A, a MEMS 600 may include several horizontal anchors 602, several vertical anchors 604, and several rods 606 connected in both parallel and series. Each of the rods 606 may be similar to the rods 102 discussed above in regard to FIG. 1A, and each of the horizontal anchors 602 and vertical anchors 604 may be similar to the anchor 104 discussed above in regard to FIG. 1A. In the illustrative embodiment, the top and bottom electrodes of each rod 606 and anchor 602, 604 are all connected together, forming one top electrode and one bottom electrode. When a voltage is placed across those electrodes, each of the rods 604 is bent from a straight position shown in FIG. 6A to a displaced position shown in FIG. 6B. The embodiment shown in FIG. 6A has fours layers 608 connected in series, with each layer 608 defined as being between two horizontal anchors 602. Each layer 608 has four sets of ten rods 606 connected in parallel, with each set having its rods 606 also connected in parallel. As a result, the MEMS 600 shown in FIG. 6A can apply forty times the force and have four times the displacement of the MEMS 100 with the single rod 102 shown in FIG. 1A.

More generally, it should be appreciated that a MEMS can be constructed from rods attached both in parallel and in series in many different ways. Rods connected in parallel will increase the stiffness of the system and allow for more force to be applied. Rods connected in series will decrease the stiffness of the system and allow for a large displacement to be applied.

Figure 7:
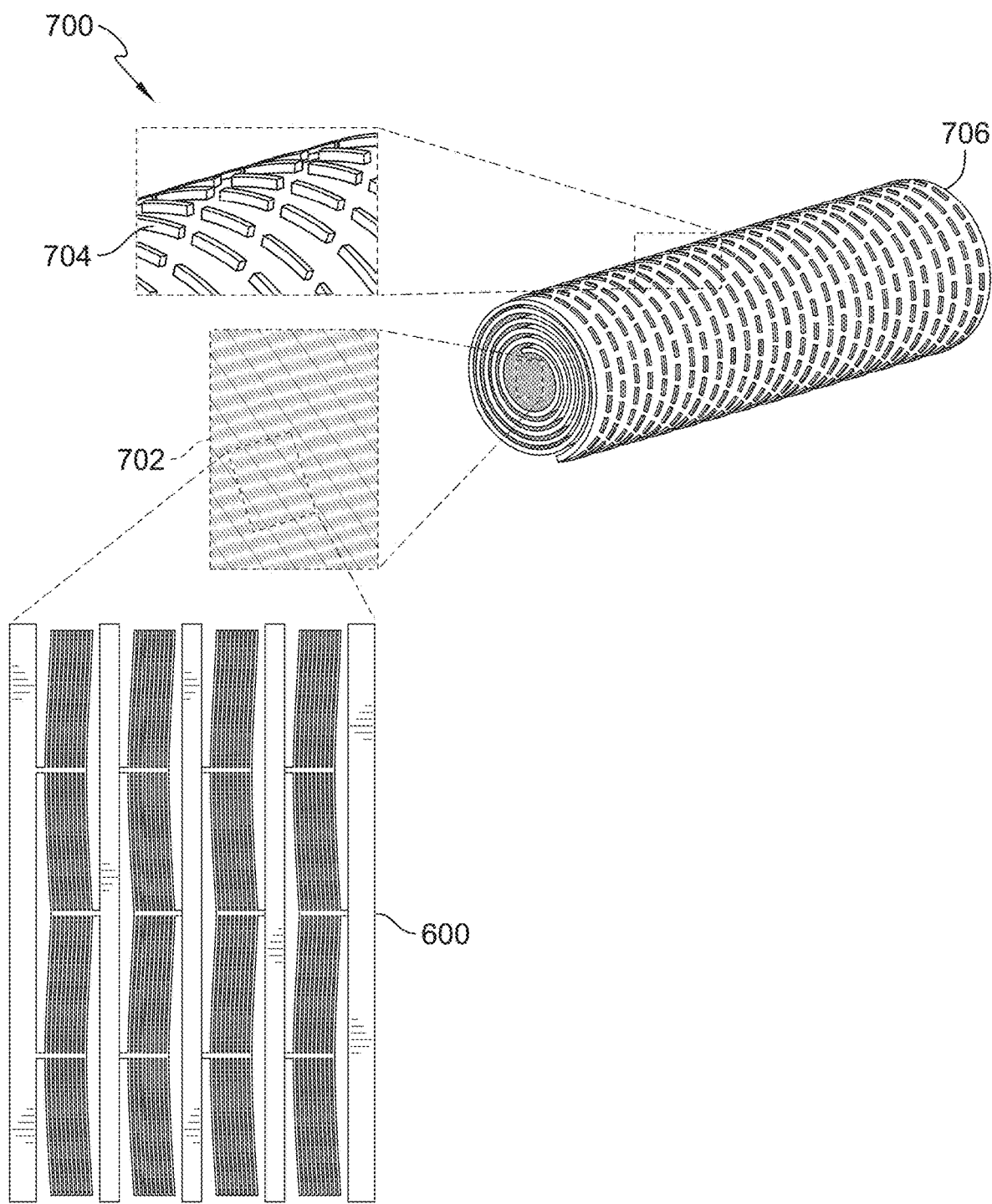
FIG. 7 is a simplified block diagram of at least one embodiment of a rolled sheet of the composable piezoelectric actuators of FIG. 6A.

Referring now to FIG. 7, in one embodiment, a MEMS 700 for a piezomuscle is shown. The piezomuscle 700 is formed from a sheet 702 of rods, anchors, and electrodes, such as the MEMS 600 described above in regard to FIG. 6A. The sheet 702 can be rolled up around an axis, forming a piezomuscle fiber 706. The top layer of the sheet 702 may be separated from the bottom layer of the sheet with layer dividers 704 to provide electrical isolation between the top and bottom of the sheet 702. When an electric field is applied across the electrodes of the MEMS 600 that form the sheet 702, the entire piezomuscle fiber 706 can expand (or contract) along the axis around which the sheet 702 is rolled.

It should be appreciated that the techniques described herein can be used to create other structures in 3D besides the sheet 702. For example, the several MEMS 600 may be stacked on top of each other along an axis perpendicular to the two-dimensional array shown in FIG. 6A.

Figure 8:
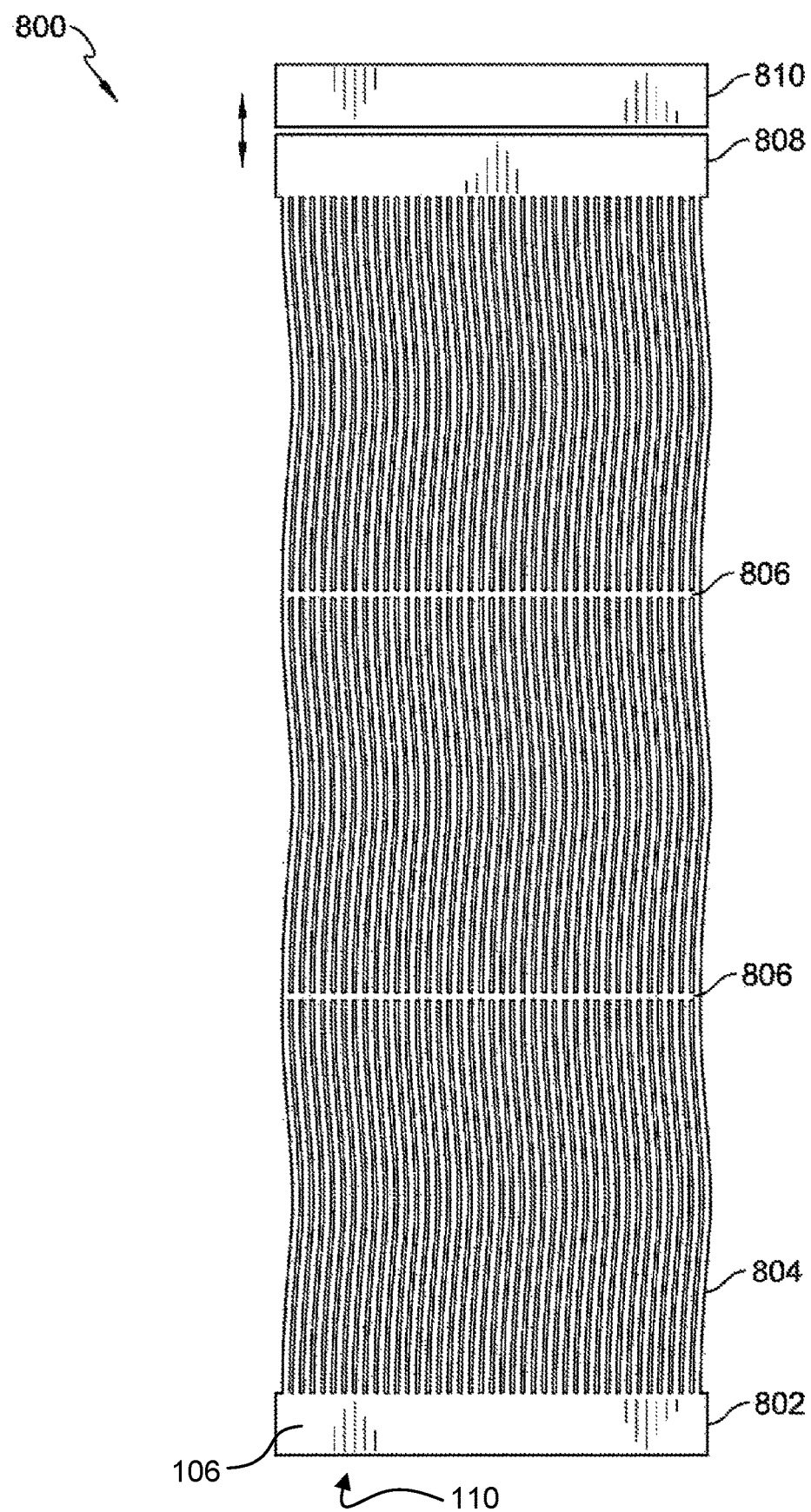
FIG. 8 is a simplified block diagram of at least one embodiment of several of the composable piezoelectric actuators of FIG. 1A connected in both parallel and series.

Referring now to FIG. 8, in one embodiment, a MEMS 800 may include a bottom anchor 802, several rods 804 and intermediate anchors 806, a moveable contact 808, and a fixed contact 810. The moveable contact 808 and the fixed contact 810 may form part of an electrical switch, such as a high power, high current switch. Each of the rods 804 may be similar to the rods 102 discussed above in regard to FIG. 1A, and each of the bottom anchor 802, intermediate anchors 806, and moveable contact 80 may be similar to the anchor 104 discussed above in regard to FIG. 1A. In the illustrative embodiment, the top and bottom electrodes of each rod 804 and anchor 802, 806 are all connected together, forming one top electrode and one bottom electrode. When a voltage is placed across those electrodes, each of the rods 804 is bent from a straight position to a displaced position. It should be appreciated that the rods 804 are configured to have no net lateral displacement, but will still have a small axial displacement, allowing the moveable contact 808 to come in and out of contact with the fixed contact 810. The MEMS 800 may have a very high stiffness and a correspondingly very high frequency response, such as several hundred megahertz, allowing the MEMS 800 to act as a high-frequency, high-power electrical switch or square wave generator.

Figure 9A:
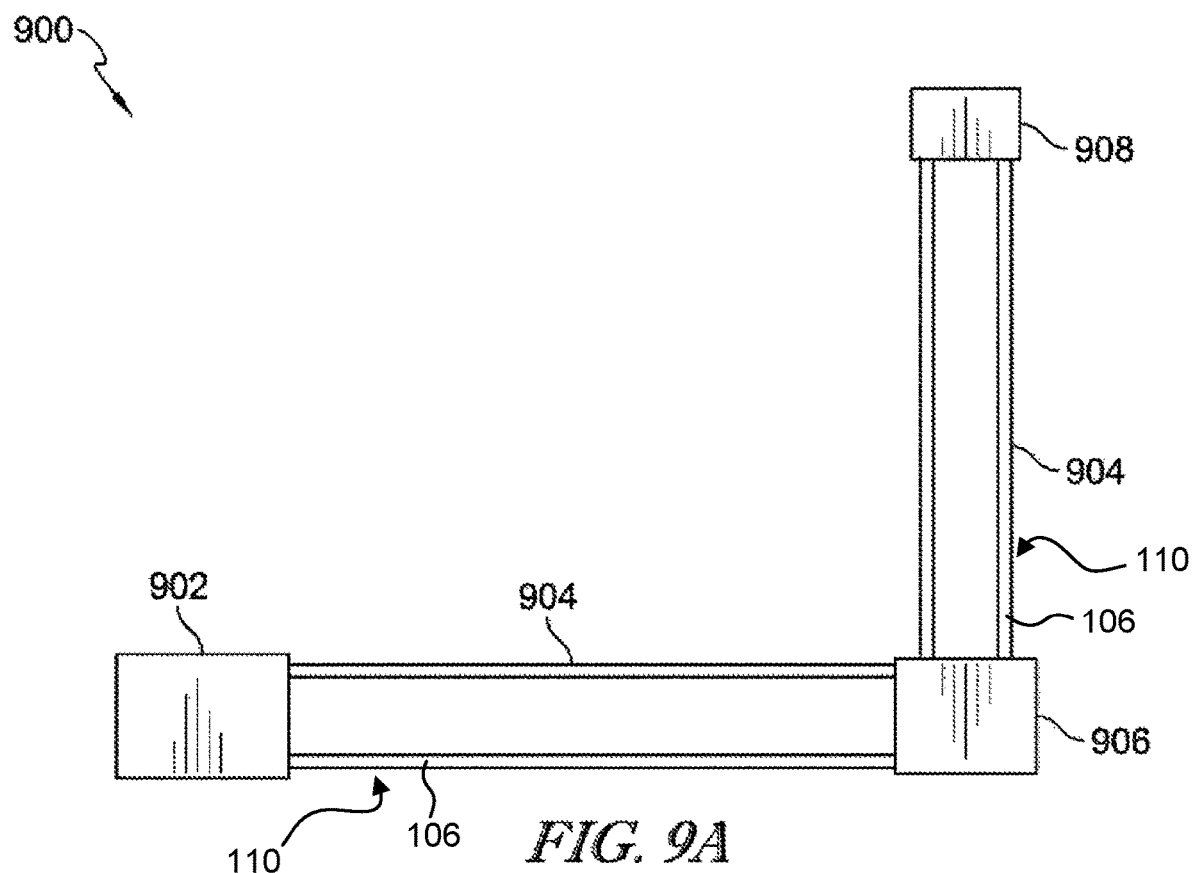
FIGS. 9A and 9B are a simplified block diagram of at least one embodiment of an actuator with multiple degrees of freedom.
Figure 9B:
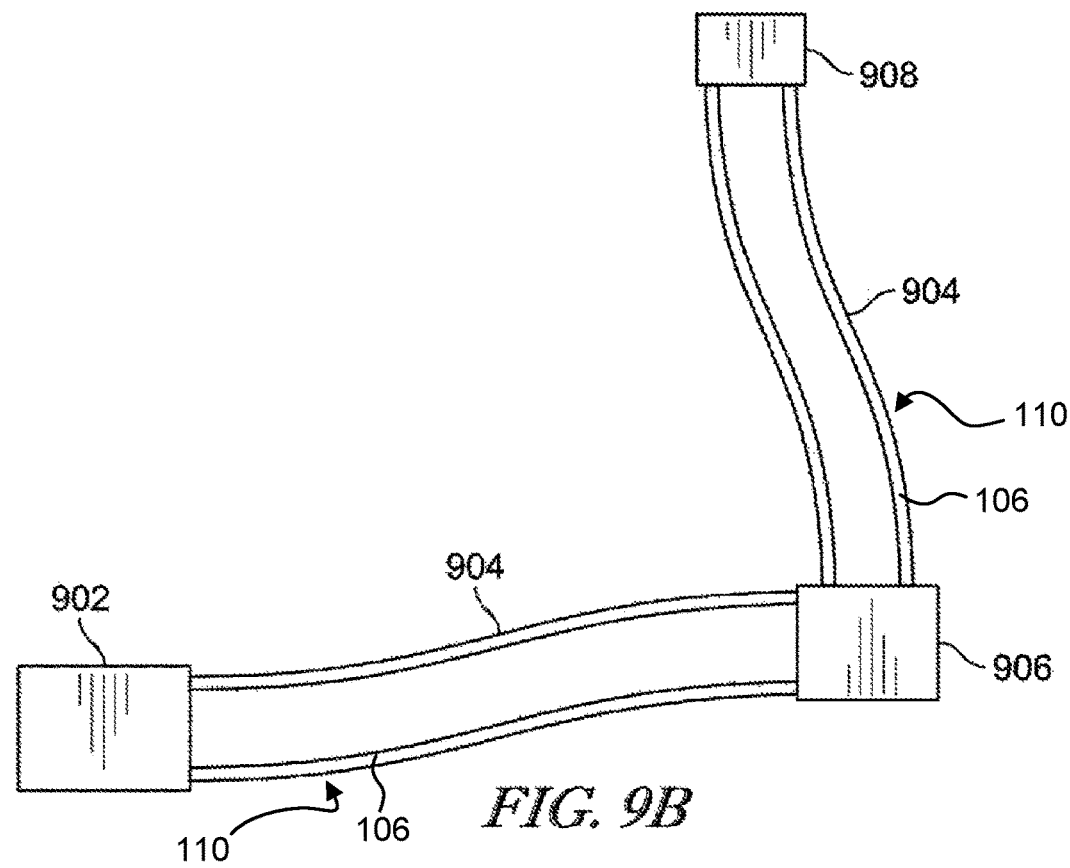

Referring now to FIGS. 9A and 9B, in one embodiment, a MEMS 900 may include several actuators connected in different directions to allow for movement in more than one direction. The MEMS 900 includes an anchor shoulder 902, several rods 904, an elbow 906, and an end anchor 908. Each of the rods 904 may be similar to the rods 102 discussed above in regard to FIG. 1A, and each of the anchors 902, 906, 908 may be similar to the anchor 104 discussed above in regard to FIG. 1A. In the illustrative embodiment, the top and bottom electrodes of each rod 904 of one segment (e.g., from the anchor shoulder 902 to the elbow 906) are all connected together, forming one top electrode and one bottom electrode. However, the electrodes of the rods 904 of a the other segment (e.g., from the elbow 906 to the end anchor 908) may be all connected together but isolated from the electrodes of the other rods 904. As such, the segment from the anchor should 902 to the elbow 906 can move independently of the segment from the elbow 906 to the end anchor 908, allowing for motion in two dimensions. Additional segments may be added to allow for motion in three dimensions as well as motion in one, two, or three degrees of rotation.

The various MEMS disclosed herein may be manufactured using any suitable technique. In some embodiments, lithographic techniques may be used to pattern, etch, grow layers, etc., to form the MEMS. For example, the MEMS 600 may be formed beginning with a layer of silicon dioxide on a silicon substrate. The bottom electrode may be patterned onto the silicon dioxide using standard techniques of applying a photoresist, patterning the electrode with a mask, etching the electrode, and removing the photoresist. Then a layer of PVDF may be spun on top of the bottom electrode. The top electrode may then be patterned onto the PVDF in a similar manner as the bottom electrode. The PVDF may then be formed into the desired pattern using an oxygen plasma etch, and the silicon and silicon dioxide can be removed, such as through another etch. The PVDF may then be polarized in the desired direction.

As another example, the MEMS 600 may be formed beginning with a sheet of PVDF. The PVDF may be mounted on a substrate that already has one electrode patterned onto it. The top electrode can then be patterned onto the PVDF, and a fluoride plasma or laser ablation may be used to etch the layers.

As another example, the MEMS 600 may be formed by depositing a layer of lead, such as on top of a bottom electrode that has already been patterned. A layer of PZT may be grown on top of the layer of lead, then the top electrode can be grown on top of the layer of PZT. Portions of the PZT can then be removed using etching.

It should be appreciated that additional or different techniques may be used to form the MEMS described herein. For example, in some embodiments, some or all of the MEMS 600 may be formed using 3D printing.

It should be appreciated that the MEMS techniques disclosed herein can be integrated into many types of systems and may perform many functions other than what is described above in regard to FIGS. 1-9. For example, in addition to controlling movement by application of a voltage, the MEMS 100 could be used to sense movement by measurement of a voltage. In some embodiments, movement of a MEMS system created using the techniques described herein may be used to harvest energy. The MEMS actuators described herein can be integrated into microrobots, allowing for large-scale mechanical movement based on simple electromechanical structure. Such robots would be able to operate in dusty or liquid environments. Impacts include microrobotics for inspection, surveillance, surgery, prosthetics, implants, manipulators, microscale 3D-printing, crop or home pest protection, plant pollination, search and rescue, environmental monitoring, assembly, etc.

In some embodiments, a device including a MEMS based on the techniques disclosed herein may be included in an energy storage device. For example, the MEMS may be mechanically distorted, either through application of a mechanical force or application of a voltage across the MEMS. The MEMS may be maintained in the mechanically distorted state, such as by movement of a locking or retaining mechanism. It should be appreciated that, if a voltage is applied to mechanically distort the MEMS, the voltage may be removed while the locking or retaining mechanism holds the MEMS in place. As such, there will be no energy loss due to, e.g., a leakage current. When energy extraction is desired, the locking or retaining mechanism may be removed, and the energy stored in mechanical distortion of the MEMS can be extracted as electrical or mechanical energy.

In some embodiments, a device including a MEMS based on the techniques described herein may be implanted into a human body. The MEMS component may apply desired mechanical forces or may harness mechanical forces applied to the MEMS component to harvest energy to power the implanted device.

It should be appreciated that certain systems can be created using the MEMS technology disclosed herein that are improvements upon current technology. For example, a stiffness of an actuator such as that shown in FIG. 8 can be controlled by changing an amount that the arms 804 are bent. Changing the stiffness changes the frequency of oscillation, allowing the frequency of oscillation to be controlled. In general, the displacement of the arms in the MEMS described herein is large compared to other MEMS systems, allowing for better sensors, such as for using MEMS to detect the Coriolis force in gyroscopes. Additionally, the insensitivity to dust, air, etc., of the MEMS described herein can allow them to be used in less carefully controlled environments.

The invention claimed is:

1. A microelectromechanical system (MEMS) comprising:
   a proximal anchor elongated along an axis;
   a plurality of elongated rods, wherein each of the plurality of elongated rods is piezoelectric, wherein each of the plurality of elongated rods has a top side and a bottom side opposite the top side, wherein the top side of each of the plurality of elongated rods has a first long edge and a second long edge, wherein each of the plurality of elongated rods has a proximal end supported by the proximal anchor, and wherein each of the plurality of elongated rods extends transverse to the axis of the proximal anchor from a first side of the proximal anchor;
   a plurality of first electrodes, wherein each of the first electrodes is disposed adjacent the bottom side of one of the plurality of elongated rods, and wherein each of the plurality of first electrodes is electrically coupled together; and
   a plurality of second electrodes, wherein each of the second electrodes is disposed adjacent the top side of one of the plurality of elongated rods, wherein each of the plurality of second electrodes is electrically coupled together, and wherein each of the second electrodes has a first segment that is closer to the first long edge of the corresponding elongated rod than the second long edge of the corresponding elongated rod and a second segment that is closer to the second long edge of the corresponding elongated rod than the first long edge of the corresponding elongated rod.

2. The MEMS of claim 1, wherein each elongated rod has a length between 20 and 2000 micrometers,
   wherein each elongated rod has a height between the top side and the bottom side between 0.1 and 100 micrometers, and
   wherein each elongated rod has a width between 0.1 and 100 micrometers.

3. The MEMS of claim 1, wherein the first and second electrodes are configured such that, when a voltage is applied across the first electrode and the second electrode, an electric field is generated between the second and first electrodes such that a first segment of the rod bends in a first direction and a second segment of the rod bends in a second direction approximately opposite the first direction.

4. The MEMS of claim 1, wherein the plurality of elongated rods comprises a first plurality of elongated rods, the MEMS further comprising:
a second plurality of elongated rods, wherein each of the second plurality of elongated rods has a proximal end that is connected to a distal end of an elongated rod of the first plurality of elongated rods,
wherein each first electrode extends along the bottom side of one of the second plurality of elongated rods;
wherein each second electrode extends along the top side of one of the second plurality of elongated rods, wherein the second electrode has a third segment that is closer to the first long edge of the corresponding elongated rod than the second long edge of the corresponding elongated rod and a fourth segment that is closer to the second long edge of the corresponding elongated rod than the first long edge of the corresponding elongated rod.

5. The MEMS of claim 1, further comprising:
a first connector electrode disposed on the proximal anchor, wherein the first connector electrode is connected to each first electrode; and
a second connector electrode disposed on the proximal anchor, wherein the second connector electrode is connected to the each second electrode.

6. The MEMS of claim 1, further comprising:
a first group of elongated rods comprising the proximal anchor, the plurality of elongated rods, and a distal anchor elongated along an axis, wherein each of the plurality of elongated rods has a distal end supported by the distal anchor; and
a second group of elongated rods comprising a second proximal anchor elongated along an axis, a second distal anchor elongated along an axis, a second plurality of elongated rods extending transverse from the second proximal anchor to the second distal anchor, a plurality of first electrodes disposed adjacent the bottom side of each of the second plurality of elongated rods, and a plurality of second electrodes disposed adjacent the top side of each of the second plurality of elongated rods;
wherein the distal anchor of the first group of elongated rods is mechanically coupled to the second proximal anchor of the second group of elongated rods such that a translation of the distal anchor of the first group of elongated rods causes a translation of the second proximal anchor of the second group of elongated rods.

7. The MEMS of claim 6, wherein the groups of elongated rods are disposed on a substrate sheet, wherein the substrate sheet is rolled around an axis parallel to the axis of the distal anchor of the at first group of elongated rods.

8. The MEMS of claim 6, further comprising:
a two-dimensional array of elongated rods comprising the groups of elongated rods, wherein each of the groups of elongated rods are substantially coplanar;
a plurality of additional two-dimensional arrays, wherein each of the plurality of two-dimensional arrays is substantially the same as the two-dimensional array of elongated rods,
wherein the two-dimensional array of elongated rods and the plurality of additional two-dimensional arrays are arranged along an axis perpendicular to the two-dimensional array.

9. The MEMS of claim 1, further comprising control circuitry electrically coupled to the first electrode and to the second electrode, wherein the control circuitry is configured to control a voltage applied across the first electrode and the second electrode.

10. The MEMS of claim 1, further comprising control circuitry electrically coupled to the first electrode and to the second electrode, wherein the control circuitry is configured to receive a current to convert mechanical energy of the elongated rod to electrical energy.

11. The MEMS of claim 1, further comprising a distal anchor elongated along an axis, wherein:
each of the plurality of elongated rods has a distal end supported by the distal anchor; and
when a first voltage is applied between the first electrodes and the second electrodes, an electric field is applied to each of the plurality of elongated rods such that each of the plurality of elongated rods applies a force to translate the distal anchor in a first direction along its axis relative to the proximal anchor.

12. The MEMS of claim 11, wherein when a second voltage is applied between the first electrodes and the second electrodes, an electric field is applied to each of the plurality of elongated rods such that each of the plurality of elongated rods applies a force to translate the distal anchor in a second direction along its axis relative to the proximal anchor, wherein the second voltage has an opposite polarity from the first voltage, and wherein the second direction is opposite the first direction.

13. A microelectromechanical system (MEMS) comprising:
a plurality of rods, each rod elongated along an axis, each rod comprising a first segment near a proximal end of the rod and a second segment near a distal end of the rod, wherein each rod is piezoelectric;
a first electrode disposed along the axis of each rod, wherein each first electrode is electrically coupled to the other first electrodes;
a second electrode disposed along the axis of each rod, wherein each second electrode is electrically coupled to the other second electrodes, wherein the first and second electrodes are configured such that, when a voltage is applied across the first electrode and the second electrode, an electric field applied to the first segment of the rod has a gradient such that the first segment of the rod bends in a first direction and an electric field applied to the second segment of the rod has a gradient such that the second segment of the rod bends in a second direction approximately opposite the first direction; and
a first anchor, a second anchor, and a third anchor;
wherein a first plurality of the plurality of rods extend in parallel between the first anchor and the second anchor, and wherein a second plurality of the plurality of rods extend in parallel between the second anchor and the third anchor.

14. The MEMS of claim 13, wherein each elongated rod has a length between 20 and 2000 micrometers,
wherein each elongated rod has a height between the top side and the bottom side between 0.1 and 100 micrometers, and
wherein each elongated rod has a width between 0.1 and 100 micrometers.

15. A microelectromechanical system (MEMS) comprising:
- an plurality of elongated rods, each of the plurality of elongated rods comprising a first segment and a second segment, wherein each of the elongated rods is piezoelectric;
- means for creating an electric field at the first segment of each of the elongated rods that causes the first segment of the rod to bend in a first direction;
- means for creating an electric field at the second segment of each of the elongated rods that causes the second segment of the rod to bend in a second direction approximately opposite the first; and
- means for mechanically connecting the plurality of elongated rods in both series and parallel.

16. The MEMS of claim 15, wherein each elongated rod has a length between 20 and 500 micrometers,
- wherein each elongated rod has a height between the top side and the bottom side between 0.1 and 100 micrometers, and
- wherein each elongated rod has a width between 0.1 and 100 micrometers.

17. The MEMS of claim 15, further comprising means for disposing the plurality of elongated rods in a coiled sheet.

* * * * *